United States Patent [19]

Suzuki et al.

[11] Patent Number: 5,532,116
[45] Date of Patent: Jul. 2, 1996

[54] AQUEOUS ALKALINE DEVELOPING SOLUTION

[75] Inventors: Tamotsu Suzuki; Mikio Totsuka; Chiyomi Niitsu; Fumiaki Shinozaki, all of Shizuoka, Japan

[73] Assignee: Fuji Photo Film Co., Ltd., Kanagawa, Japan

[21] Appl. No.: 201,693

[22] Filed: Feb. 25, 1994

Related U.S. Application Data

[63] Continuation-in-part of Ser. No. 2,584, Jan. 11, 1993, abandoned.

[30] Foreign Application Priority Data

Jan. 13, 1992 [JP] Japan ................... 4-23249
Jan. 24, 1992 [JP] Japan ................... 4-34149

[51] Int. Cl.$^6$ ....................... G03F 7/32
[52] U.S. Cl. ................... 430/331; 430/165; 430/167; 430/302; 510/176; 510/206
[58] Field of Search .................... 430/331, 309, 430/302, 165, 167; 252/156

[56] References Cited

U.S. PATENT DOCUMENTS

| | | |
|---|---|---|
| 4,348,954 | 9/1982 | Okishi ................... 430/331 |
| 4,374,920 | 2/1983 | Wanat et al. ................... 430/309 |
| 4,820,621 | 4/1989 | Tanka et al. ................... 430/331 |
| 4,959,296 | 9/1990 | Yoshida et al. ................... 430/331 |
| 5,149,614 | 9/1992 | Akiyama et al. ................... 430/331 |
| 5,246,818 | 9/1993 | Liu ................... 430/331 |
| 5,316,892 | 5/1994 | Walls et al. ................... 430/331 |

*Primary Examiner*—John S. Y. Chu
*Attorney, Agent, or Firm*—McAulay Fisher Nissen Goldberg & Kiel

[57] ABSTRACT

An aqueous alkaline developing solution comprises an alkali compound, water and an alkylnaphthalene sulfonate having the following formula:

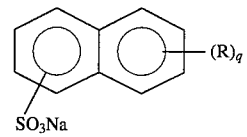

in which R represents an alkyl group of 3 to 5 carbon atoms and q is 0 or an integer of 1 to 3, in the amount of 1 to 20 weight %. The aqueous alkaline developing solution further contains an anionic surface active agent of the specific sulfonate compound having a naphthalene ring and a polypolyoxyethylene moiety, in the amount of 0.1 to 10 weight % and an nonionic surface active agent having a polyoxyethylene moiety and an aromatic ring in its structure in the amount of 0.03 to 3 weight %, or contains an anionic surface active agent of the specific sulfonate compound having the specific aralkyl-substituted benzene ring and a polypolyoxyethylene moiety.

7 Claims, No Drawings

AQUEOUS ALKALINE DEVELOPING SOLUTION

FIELD OF THE INVENTION

This is a continuation-in-part of parent case Ser. No. 08/002,584, filed Jan. 11, 1993, now abandoned. This invention relates to an aqueous alkaline developing solution which is advantageously employed for an image forming process in the field of printing arts.

BACKGROUND OF THE INVENTION

A light-sensitive image forming material has a layer comprising a light-sensitive resin which is capable of forming an image by imagewise exposure. The light-sensitive resin is made soluble or insoluble in a solvent accompanying to its molecular structure change caused by exposure to light. The formation of an image is carried out by taking advantage of the above phenomenon of the light-sensitive resin. The light-sensitive image forming material having such light-sensitive resin is mainly utilized in the fields of photograph, printing plates and plate making, which require producing visible images. The material can be, in more detail, employed for preparation of a PS (Presensitized) lithograph and a resin relief plate, photoresists such as a film type photoresist, color proofs in prepress, and lithfilms for dot to dot work.

For example, the light-sensitive image forming material employable for giving a proof to check hue and tone of a finished print has a structure comprising a support (may be referred to as tentative support hereinafter) and a light-sensitive resin layer containing a pigment which is provided thereon or a structure comprising a support and a combination of a colorant layer containing a pigment and a light-sensitive resin layer provided thereon. If necessary, a peel layer comprising an organic polymer, or a combination of the peel layer and a barrier layer comprising an organic polymer is provided on the support.

In the case of using the above light-sensitive image forming material as the image forming material (light-sensitive transferring sheet) in the surprint method (which is one of color proofing methods), the material is imagewise exposed to light to form an image on the support or the peel layer through development and then the resultant image (i.e., separation image) is transferred to a desired support to prepare a color proofing sheet having the separation image.

Such color proofing sheet is used to check hue and tone of a finished print as mentioned above, so that a separation image formed on a light-sensitive image forming material is desired to show a distinct hue.

To form a color image on a light-sensitive image forming material, an organic pigment is employed as a colorant material in the light-sensitive resin layer, because the pigment is excellent in various characteristics such as sharpness and concentration (coloring power) and has abundant hues. The color image is obtained by applying a coating solution (which is prepared through mixing the organic pigment and a light-sensitive resin) to a support or a peel layer provided on a support to prepare a light-sensitive image forming material, and exposing imagewise the material to light and then removing a soluble portion of the resin layer by developing the exposed material in a developing solution.

In the formation of the color image, the developing solution used in the developing procedure plays a important role in the point whether a color image having excellent characteristics mentioned above can be obtained or not. As the developing solution, for example, Japanese Provisional Patent Publication Nos. 1 (1989)-282543 and 3 (1991)-198046, U.S. Pat. No. 5,004,668, No. 4,766,053, No. 4,877,712, No. 4,482,625 and No. 5,149,614 disclose an alkaline developing solution containing a specific surface active agent, which is a mixture of plural compounds having the following formula:

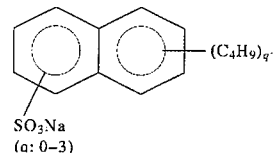

and is available from Kao Atlas Co., Ltd. as a trade name of Pelex NBL.

The addition of the surface active agent to a developing solution is effective to improve wetting properties of the light-sensitive resin layer and therefore the use of such developing solution is thought to shorten the developing time.

The present inventors have studied the developing solution and discovered that use of the developing solution containing such surface active agent is not capable of forming an image having excellent characteristics (sharpness and coloring power) in a reduced developing time. In more detail, use of the developing solution is apt to bring about occurrence of fog of a coloring material on the support or the peel layer and the occurrence of fog is not satisfactorily prevented even if the developing time is lengthened.

Further, the inventors have discovered that if such developing solution is stored at a low temperature in the form of its original solution before diluting it to be frozen, the developing solution using the frozen original solution through thawing (melting) does not exhibit the excellent characteristics similar to those before the freezing, i.e., has not a satisfactory freeze-thaw stability. In more detail, when the frozen developing solution is thawed, a small amount of precipitate is observed in the solution. It is thought that this precipitation reduces the developing characteristics

SUMMARY OF THE INVENTION

To solve the above problems, the inventors have further studied the composition of the aqueous alkaline developing solution. As a result of the study, it has been clarified that the use of the aqueous alkaline developing solution containing a combination of the anionic surface active agent having the following formula (II) or the following formula (III) and the specific nonionic surface active agent, shortens the developing time of a light-sensitive image forming material and prevents an image formed on the light-sensitive image forming material (on a support or a peel layer) from the occurrence of fog and exhibits the above excellent developing characteristics in the case that the frozen developing solution, owing to for example storage at a low temperature, is thawed and then is used.

An object of the present invention is to provide an aqueous alkaline developing solution which is capable of forming a distinct image showing little occurrence of fog of a coloring material even when the development is performed in a shortened time in an image forming process.

Another object of the invention is to provide an aqueous alkaline developing solution which is capable of processing an increased number of light-sensitive image forming materials in the case of using its definite amount.

Further, an object of the invention is to provide an aqueous alkaline developing solution with which little bubbles are produced.

Furthermore, an object of the invention is to provide an aqueous alkaline developing solution having freeze-thaw stability which exhibits the above excellent developing characteristics even in the case of using the once frozen developing solution through melting.

There is provided by the present invention an aqueous alkaline developing solution comprising an alkali compound, water and an alkylnaphthalene sulfonate having the following formula (I):

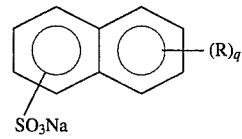
(I)

in which R represents an alkyl group of 3 to 5 carbon atoms and q is 0 or an integer of 1 to 3, in the amount of 0.5 to 20 weight %;

which further contains an anionic surface active agent having the following formula (II):

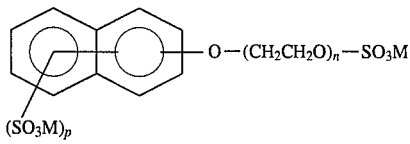
(II)

in which M represents Na, K or $NH_4$, p is 0 or 1 and n is 2 to 20, in the amount of 0.1 to 10 weight % and an nonionic surface active agent having a polyoxyethylene moiety and an aromatic ring in its structure in the amount of 0.01 to 4 weight %.

The preferred embodiments of the above-mentioned aqueous alkaline developing solution are as follows:

1) The aqueous alkaline developing solution wherein the aromatic ring of the nonionic surface active agent is a naphthalene ring or alkylbenzene ring.
2) The aqueous alkaline developing solution wherein the aromatic ring of the nonionic surface active agent is a naphthalene ring.
3) The aqueous alkaline developing solution wherein the ratio of the anionic surface active agent to the nonionic surface active agent is in the range of 1:0.05 to 1:1 (anionic surface active agent: nonionic surface active agent), by weight.
4) The aqueous alkaline developing solution wherein the nonionic surface active agent to the nonionic surface active agent is contained in the amount of 0.03 to 3 weight %.
5) The image forming process wherein the developing solution further contains a silicone-type anti-foaming agent.

There is also provided by the present invention an aqueous alkaline developing solution comprising an alkali compound, water and an alkylnaphthalene sulfonate having the following formula (I):

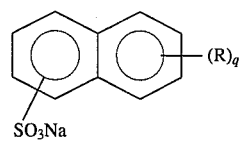
(I)

in which R represents an alkyl group of 3 to 5 carbon atoms and q is 0 or an integer of 1 to 3, in the amount of 0.5 to 20 weight %;

which further contains an anionic surface active agent having the following formula (III):

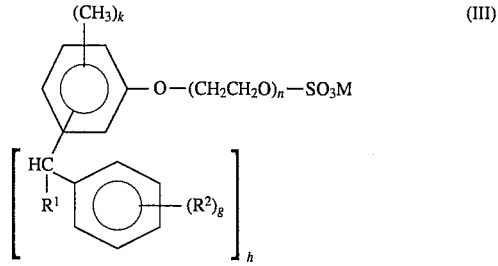
(III)

in which each of $R^1$ and $R^2$ represents alkyl of 1 to 5 carbon atoms, M represents Na, K or $NH_4$, g is 0, 1 or 2, k is 0, 1 or 2, h is an integer of 1 to 3, and n is 2 to 20, in the amount of 1 to 20 weight %.

The preferred embodiments of the above-mentioned aqueous alkaline developing solution are as follows:

1) The aqueous alkaline developing solution which further contains a nonionic surface active agent having a polyoxyethylene moiety and an aromatic ring in its structure in the amount of 0.01 to 4 weight % (preferably 0.03 to 3 weight %).
2) The aqueous alkaline developing solution as defined in above 1), wherein the aromatic ring of the nonionic surface active agent is a naphthalene ring or alkylbenzene ring.
3) The aqueous alkaline developing solution as defined in above 1), wherein the aromatic ring of the nonionic surface active agent is a naphthalene ring.
4) The aqueous alkaline developing solution as defined in above 1), wherein the ratio of the anionic surface active agent to the nonionic surface active agent is in the range of 1:0.05 to 1: 1 (anionic surface active agent: nonionic surface active agent, by weight.
5) The image forming process wherein the developing solution further contains a silicone-type anti-foaming agent.

The aqueous alkaline developing solution can be advantageously utilized for an image forming process the steps of:

imagewise exposing to light a light-sensitive image forming material comprising either a support and a light-sensitive resin layer containing a pigment provided thereon, or a support, a colorant layer containing the pigment provided thereon and a light-sensitive resin layer provided on the colorant layer, and developing the image forming material in an aqueous alkaline developing solution to remove a soluble portion of the latent image (the light-sensitive resin layer) and then form an image on a support or a peel layer provided on the support.

The process can be utilized advantageously in formation of a color image on a color proofing sheet by a surprint method.

In an image forming process such as the above process, the use of the aqueous alkaline developing solution of the invention enables the formation of a distinct image on the light-sensitive image forming material (or on the peel layer) by reduction of fog of a coloring material even if its developing time is shortened, and therefore enables processing of increased number of the light-sensitive image forming materials (films), as compared with the use of the conventional alkaline developing solution. Further, the use of the aqueous alkaline developing solution of the invention shows an excellent effect that bubbles hardly occurs in the developing solution. The occurrence of bubbles inhibits formation of a distinct image.

Furthermore, the aqueous alkaline developing solution of the invention shows excellent freeze-thaw stability. In more detail, if such developing solution is stored at a low temperature in the form of its original solution before diluting it to be frozen, the developing solution using the frozen original solution through thawing exhibits the excellent characteristics similar to those before the freezing.

Hence, the aqueous alkaline developing solution of the invention enables the formation of a distinct image on the light-sensitive image forming material and the aqueous alkaline developing solution of the invention shows excellent stability for freezing.

DETAILED DESCRIPTION OF THE INVENTION

The aqueous alkaline developing solution according to the present invention is, for example, advantageously utilized for the following image forming process.

The image forming process basically comprising the following steps:

(i) imagewise exposing to light a light-sensitive image forming material comprising a support and a light-sensitive resin layer containing a pigment (or a colorant layer containing the pigment and a light-sensitive resin layer), superposed in order, to form a latent image in the light-sensitive resin layer and (ii) developing the latent image in the light-sensitive resin layer (or the colorant layer and a light-sensitive resin layer) using one of the above-mentioned alkaline developing solutions to remove a soluble portion of the latent image (the light-sensitive resin layer) and then form an image on a support, or a peel layer or a combination of a barrier layer and a peel layer provided on the support.

The light-sensitive image forming material employable for the process is prepared according to the process described below.

The support serves for supporting various layers (e.g., a peel layer, and a light-sensitive resin layer) provided thereon. The material of the support preferably has an excellent heat-resistance and chemical-resistance, and flexibility. Further, in the case that an exposure of the material to light is conducted by means of light applied from the support side, the support is preferred to have a high transmittance at a wavelength of the light source using for the exposure.

Examples of materials of the support include polyesters such as polyethylene terephthalate (PET), polycarbonate, polystyrene, cellulose derivatives such as cellulose triacetate, polyolefins such as polypropylene, polyacrylonitrile, polyvinyl chloride, polyvinylidene chloride, polyacrylates such as PMMA (polymethyl methacrylate), polyamides such as nylon, polyimide and polysulfone. Further, there can be mentioned examples described in Japanese Provisional Patent Publication Nos. 47(1972)-41830, 48(1973)-9337 and 51(1976)-5101. Preferred are polyethylene terephthalate, polycarbonate and heat-treated materials thereof. The thickness of the support is generally in the range of 5 to 300 µm, and preferably in the range of 20 to 150 µm.

On the surface of the support opposite to the light-sensitive resin layer, a back layer comprising a polymer such as polyvinyl butyral, vinyl chloride/vinyl acetate copolymer or cellulose acetate resin may be provided from the viewpoint of improvement of workability. Further, the back layer may contain various additives such as a matting agent.

Although on the support may be provided the light-sensitive resin layer comprising a pigment and a light-sensitive resin or the colorant layer comprising a pigment, the peel layer or a combination of the peel layer and the barrier layer is preferably formed on the support before the formation of the light-sensitive resin layer or the colorant layer. In more detail, it is preferred that either the peel layer is first formed on the support and the light-sensitive resin layer or the colorant layer is formed on the peel layer, or the peel layer and the barrier layer are formed on the support in order and the light-sensitive resin layer or the colorant layer is formed on the barrier layer. The barrier layer on the peel layer prevents the peel layer from invasion of a solvent or an alkaline solution because the barrier layer is excellent in solvent resistance and alkali resistance.

Materials employable for the peel layer can be appropriately selected from known materials for a peel layer. Examples of such materials include alcohol-soluble polyamide, polyhydroxystyrene, polyvinyl acetate, poly(meth)acrylate, polyvinyl chloride, polyvinyl butyral, polyvinyl butyrate, methyl methacrylate/acrylate (e.g., ethyl acrylate) copolymer, cellulose acetate butyrate, ethylene/unsaturated carboxylic acid copolymer (which may be crosslinked via metal atom), vinyl chloride/vinyl acetate copolymer, cellulose diacetate, cellulose triacetate, polyvinyl alcohol and a composition prepared by blending styrene/partially esterified maleic anhydride copolymer with methoxymethylated nylon. These materials can be employed singly or in combination of two or more kinds. A mixture of alcohol-soluble polyamide and polyhydroxystyrene is preferred.

The peel layer is formed by coating a coating solution prepared through dissolving the above materials in an appropriate solvent on the support and drying the coated layer. The coating solution may contain various surface active agents for improvement of the surface state of the peel layer. Particularly, fluoro-type (fluorine containing) surface active agents are preferred. The thickness of the peel layer is generally in the range of 0.1 to 20 µm, preferably in the range of 0.2 to 5 µm and more preferably in the range of 0.3 to 3 µm.

The barrier layer is formed on the peel layer, if desired. Examples of materials employable for the barrier layer include polyacrylate, polymethacrylate (e.g., polymethyl methacrylate), acrylate/methacrylate copolymer, polyacrylamide and copolymer of acrylamide/monomer polymerizable with the acrylamide. Further, there can be mentioned examples described in Japanese Provisional Patent Publication No. 63(1988)-2039. Preferred is polymethylmethacrylate.

The barrier layer is formed by coating a coating solution prepared through dissolving the above materials in an appropriate solvent on the peel layer and drying the coated layer. The coating solution may contain various surface active agents. As the surface active agents, fluoro-type (fluorine-containing) surface active agents are effective. The thickness of the barrier layer is generally in the range of 0.1 to 20 µm, preferably in the range of 0.2 to 5 µm and more preferably in the range of 0.3 to 3 µm.

A representative example of the light-sensitive resin material has a structure consisting of a support, a peel layer, (a barrier layer if necessary) and a light-sensitive resin layer containing a pigment superposed in order.

Materials employable for the light-sensitive resin layer can be selected from known light sensitive resin materials for alkaline development. As N → P (negative to positive) type light-sensitive resin, a composition prepared by blending an azide type light-sensitive agent such as 2,6-di(4'-azidobenzal)cyclohexane with a novolak type phenol-formaldehyde resin, and a composition prepared by blending a polyfunctional monomer such as trimethylolpropane triacrylate, a photopolymerization initiator such as Michler's ketone or benzyl methacrylate/methacrylic acid copolymer as a binder are preferred. As P → P (positive to positive) type light-sensitive resin, a light-sensitive resin composition comprising a quinoneazide type light-sensitive agent such as o-quinonediazide is preferred.

The pigment contained in the light-sensitive resin layer can be selected from known various inorganic and organic pigments. The content of the pigment contained in the light-sensitive resin layer, although varies depending on its shape or its particle size, is generally in the range of 1 to 30 weight % based on the weight of the total solid content in the layer, and preferably in the range of 2 to 10 weight %.

The light-sensitive resin layer containing a pigment is formed on the peel layer (or the barrier layer) by preparing a coating solution by mixing the light-sensitive resin, the above pigment and an appropriate solvent, coating the resultant solution on the peel layer (or the barrier layer) and then drying the coated layer to form the light-sensitive resin layer. The thickness of the light-sensitive resin layer containing a pigment is generally in the range of 0.5 to 100 μm, preferably in the range of 1.0 to 50 μm and more preferably in the range of 1.0 to 20 μm.

Another embodiment of the light-sensitive image forming material employable for the image forming process of the invention has two layers comprising both a colorant layer containing the above pigment provided on the peel layer and a light-sensitive resin layer containing no pigment provided on the colorant layer (which may be superposed in order or in reverse order) instead of the light-sensitive resin layer containing the pigment.

The colorant layer generally is a layer comprising the above pigment or the pigment and resin. As materials of the resin, the resin materials employed in the light-sensitive resin layer mentioned above can be generally employed. For example, alkali-soluble type resins such as a novolak type phenol-formaldehyde resin and benzyl methacrylate/methacrylic acid copolymer can be mentioned. Further, a monomer such as polyfunctional monomer and a photopolymerization initiator may be employed.

The colorant layer containing a pigment is formed on the support, the peel layer or the barrier layer (otherwise the light-sensitive resin layer) by preparing a coating solution by mixing the pigment or the pigment and the above resin, and an appropriate solvent, coating the resultant solution on the peel layer or the above other layers and then drying the coated layer to form the colorant layer. The thickness of the colorant layer containing a pigment is generally in the range of 0.1 to 5 μm, preferably in the range of 1.0 to 3.0 μm and more preferably in the range of 1.0 to 2.5 μm.

A light-sensitive resin layer provided on or under the colorant layer generally is a light-sensitive resin layer containing no pigment, and is the same as the light-sensitive resin layer containing pigment except for containing no pigment.

The light-sensitive resin layer containing no pigment is formed on the colorant layer, otherwise on the support, the peel layer or the barrier layer (i.e., under the colorant layer) by preparing a coating solution by mixing the light-sensitive resin and an appropriate solvent, coating the resultant coating solution on the colorant layer or the above other layers and then drying the coated layer to form the light-sensitive resin layer. The thickness of the light-sensitive resin layer layer containing no pigment is generally in the range of 0.1 to 5 μm, preferably in the range of 0.2 to 3.0 μm and more preferably in the range of 0.3 to 1.0 μm.

In the case that the light-sensitive resin is the N → P type, a protective layer is preferably formed on the light-sensitive resin layer. Examples of polymers employable for the protective layer include polyvinyl alcohol, polyvinyl acetate, methyl vinyl ether/maleic anhydride copolymer, poly(N-vinylpyrrolidone), gelatin and gum arabic. The protective layer is formed by coating a solution of the above polymer on the light-sensitive resin layer and drying the coated layer.

In the developing procedure of the image forming method using the above-mentioned light-sensitive image forming material, the aqueous alkaline developing solution of the invention is employable.

The aqueous alkaline developing solution basically comprises an alkali compound, water and an alkyl naphthalene sulfonate having the following formula (I):

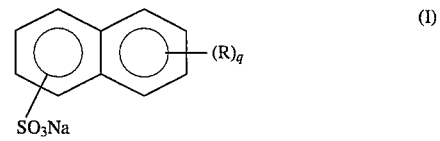

in which R represents an alkyl group of 3 to 5 carbon atoms q is 0 or an integer of 1 to 3, in the amount of 0.5 to 20 weight % (preferably 1 to 15 weight %). The formula (I) preferably is the following formula:

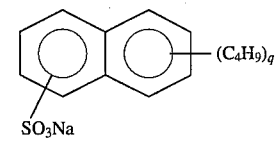

The alkyl naphthalene sulfonate having the formula (I) is usually a mixture of compounds in which q of the formula (I) is 0 or an integer of 1 to 3. Further, the aqueous alkaline developing solution contains an anionic surface active agent having the following formula (II):

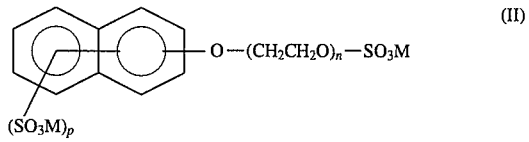

in which M represents Na, K or $NH_4$, p is 0 or 1 and n is 2 to 20, in the amount of 0.1 to 10 weight % and an nonionic surface active agent having a polyoxyethylene moiety and an aromatic ring in its structure in the amount of 0.01 to 4 weight %.

The anionic surface active agent of the formula (II) is preferably contained in the amount of 0.3 to 7 weight % and more preferably in the amount of 0.5 to 5 weight %. The amount of the anionic surface active agent is set forth in terms of solid content based on the original aqueous alkaline developing solution before dilution of water (generally diluted with water 3–10 times the solution). In the formula (II), M preferably represents Na, p preferably is 0, and n preferably is 3 to 20 and more preferably 4 to 18. Further, the anionic surface active agent of the formula (II) may contain one in which M is hydrogen.

Subsequently, concrete examples of the formulae (II) are described below.

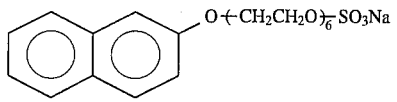 (A-1)

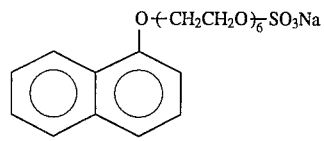 (A-2)

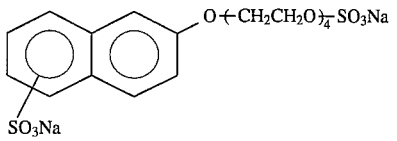 (A-3)

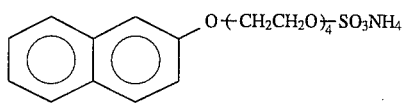 (A-4)

The nonionic surface active agent is preferably contained in the amount of 0.03 to 3 weight %, more preferably 0.05 to 2 weight % and most preferably in the amount of 0.1 to 1 weight %. The amount of the nonionic surface active agent is set forth in terms of solid content based on the original aqueous alkaline developing solution before dilution of water (generally diluted with water 3–10 times the solution). The nonionic surface active agent having a polyoxyethylene moiety and an aromatic ring in its structure preferably is polyoxyethylene alkylphenyl ether (i.e., having an alkylbenzene ring) or polyoxyethylene naphtyl ether (i.e., having a naphthalene ring), and more preferably polyoxyethylene naphtyl ether. The number of the oxyethylene moiety preferably is in the range of 2 to 50, more preferably in the range of 3 to 30, and most preferrably in the range of 4 to 20. The alkyl of the polyoxyethylene alkylphenyl ether generally has carbon atoms of 1 to 20, preferably 3 to 20 and more preferably 4 to 15.

The ratio of the anionic surface active agent to the nonionic surface active agent preferably is in the range of 1:0.05 to 1:1 (anionic surface active agent: nonionic surface active agent), by weight and more preferably in the range of 1:0.1 to 1:0.5.

The aqueous alkaline developing solution which contains the anionic surface active agent having the formula (II) and the nonionic surface active agent, enables the formation of a distinct image on the light-sensitive image forming material and shows satisfactory freeze-thaw stability.

Otherwise, the aqueous alkaline developing solution of the invention basically comprises an alkali compound, water and an alkylnaphthalene sulfonate having the formula (I) in the amount of 0.5 to 20 weight % and further contains an anionic surface active agent having the following formula (III):

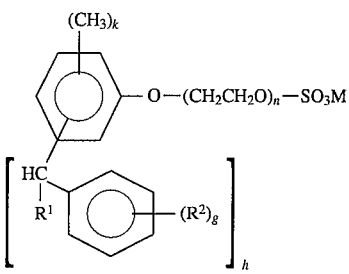 (III)

in which each of $R^1$ and $R^2$ represents alkyl of 1 to 5 carbon atoms, M represents Na, K or $NH_4$, g is 0, 1 or 2, k is 0, 1 or 2, h is an integer of 1 to 3, and n is 2 to 20, in the amount of 0.1 to 20 weight %.

The anionic surface active agent of the formula (III) is preferably contained in the amount of 0.3 to 7 weight % and more preferably in the amount of 0.5 to 5 weight %. The amount of the anionic surface active agent is set forth in terms of solid content based on the original aqueous alkaline developing solution before dilution of water (generally diluted with water 3–10 times the solution).

In the formula (III), each of $R^1$ and $R^2$ preferably represents alkyl of 1 to 3 carbon atoms and more preferably methyl, M preferably represents Na, g preferably is 0 or 1, k preferably is 0 or 1 or 2, and n preferably is 3 to 20 and more preferably 4 to 18. Further, the anionic surface active agent of the formula (III) may contain one in which M is hydrogen.

Subsequently, concrete examples of the formulae (III) are described below.

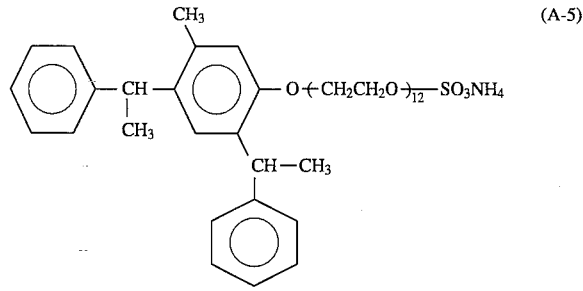 (A-5)

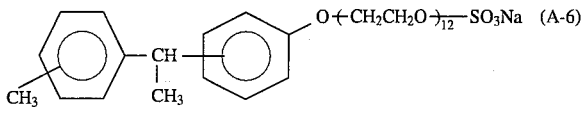 (A-6)

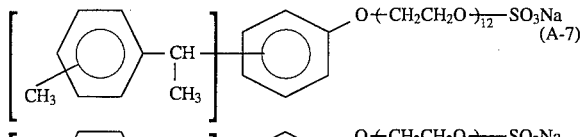 (A-7)

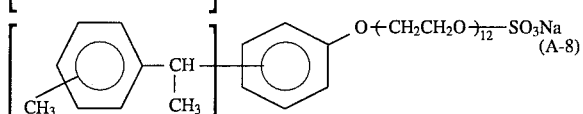 (A-8)

The aqueous alkaline developing solution which contains the anionic surface active agent having the formula (III) and no nonionic surface active agent, enables the easy formation of a distinct image on the light-sensitive image forming material although the aqueous alkaline developing solution does not show excellent stability for freezing.

The above aqueous alkaline developing solution containing the anionic surface active agent having the formula (III), preferably contains a nonionic surface active agent having a polyoxyethylene moiety and an aromatic ring in its structure in the amount of 0.01 to 4 weight %.

The nonionic surface active agent is preferably contained in the amount of 0.03 to 3 weight %, more preferably in the amount of 0.05 to 2 weight % and most preferably in the amount of 0.1 to 1 weight %. The nonionic surface active agent having a polyoxyethylene moiety and an aromatic ring in its structure preferably is polyoxyethylene alkylphenyl ether (i.e., having an alkylbenzene ring) or polyoxyethylene naphtyl ether (i.e., having a naphthalene ring), and more preferably polyoxyethylene naphtyl ether. The number of the oxyethylene moiety preferably is in the range of 2 to 50, more preferably in the range of 3 to 30, and most preferably in the range of 4 to 20. The alkyl of the polyoxyethylene alkylphenyl ether generally has carbon atoms of 1 to 20, preferably 3 to 20 and more preferably 4 to 15.

The ratio of the anionic surface active agent to the nonionic surface active agent preferably is in the range of 1:0.05 to 1:1 (anionic surface active agent: nonionic surface active agent), by weight and more preferably in the range of 1:0.1 to 1:0.5.

The aqueous alkaline developing solution which contains the anionic surface active agent having the formula (III) and no nonionic surface active agent, enables the easy formation of a distinct image on the light-sensitive image forming material.

In the invention, other than the anionic surface active agents and the nonionic surface active agent of the invention, the following surface active agents may be employed.

Examples of the anionic surface active agent include:

(i) surface active agents of carboxylic acid-type (type of a salt of carboxylic acid) such as salts of fatty acid, salts of abietic acid, partially saponified styrene/maleic anhydride copolymers and partially saponified olefin/maleic anhydride copolymers;

(ii) surface active agents of sulfonate-type (type of a salt of sulfonic acid, i.e., type having sulfonate group) such as salts of hydroxyalkane sulfonic acid, salts of alkanesulfonic acid, salts of dialkylsulfosuccinate, salts of arylsulfonic acid (e.g., salts of straight chain-alkylbenzenesulfonic acid, salts of branched-alkylbenzenesulfonic acid and salts of alkylnaphthalenesulfonic acid), salts of alkyldiphenyl ether sulfonic acid, salts of alkylphenoxypolyoxyethylenepropylsulfonic acid, salts of polyoxyethylenepropylsulfonic acid, salts of polyoxyethylenealkylsulfophenyl ether, sodium salts of N-methyl-N-oleyltaurine, salts of alkylamidesulfonic acid, disodium salts of N-alkylsulfosuccinic acid monoamide, alkali metal sulfonate of dibasic acid aliphatic ester, formaldehyde condensation products of alkylnaphthalenesulfonate, compounds having a skeleton of alkali metal benzoimidazolesulfonate and salts of petroleum sulfonic acid;

(iii) surface active agents of sulfate-type (type of an ester and salt of sulfuric acid, i.e., type having a sulfate group) such as sulfated castor oil, sulfated neat's foot oil, salts of alkylsulfate {e.g., salts of fatty acid alkylester sulfate (i.e., salts of sulfated fatty acid alkyl ester), salts of higher fatty alcohol sulfate (i.e., salts of sulfated higher fatty alcohol) and disodium alkylsulfate}, salts of polyoxyethylene alkyl ether sulfate, salts of fatty acid monoglyceride sulfate, salts of polyoxyethylene alkylphenyl ether sulfate and salts of polyoxyethylene styrylphenyl ether sulfate; and (iv) surface active agents of phosphate-type (type of an ester(s) and salt of phosphoric acid, i.e., type having phosphate group) such as salts of alkylphosphate, salts of polyoxyethylene alkyl ether phosphate and salts of polyoxyethylene alkylphenyl ether phosphate.

The anionic surface active agent may be used singly or in a combination of two or more kinds.

Preferred are the anionic surface active agents of sulfonate-type and the anionic surface active agents of sulfate-type. Particularly, salts of alkylnaphthalenesulfonic acid, salts of alkyldiphenyl ether sulfonic acid, salts of straight chain-alkylbenzenesulfonic acid and salts of polyoxyethylene alkylphenyl ether sulfate are preferred.

Further, examples of the salts of higher fatty alcohol sulfate include sodium lauryl alcohol sulfate, sodium stearyl alcohol sulfate, ammonium octyl alcohol sulfate, ammonium lauryl alcohol sulfate and disodium alkylsulfate, and an example of glycerol monoester sulfate (salt) includes $CH_2(OCOR)CH(OH)CH_2(OSO_3Na)$ wherein R is an alkyl group.

Examples of alkali metal aryl sulfonate of the sulfonate-type surface active agents include sodium dodecylbenzenesulfonate, sodium isopropylnaphthalenesulfonate, sodium dinaphthalenesulfonate and sodium m-nitrobenzenesulfonate, an example of the alkali metal alkylamidesulfonate includes $C_{17}H_{35}CON(CH_3)-CH_2CH_2SO_3Na$, examples of the alkali metal dibasic acid aliphatic ester sulfonate includes sodium sulfosuccinic acid dioctylester and sodium sulfosuccinic acid dihexylester, an example of the salt of alkylnaphthalenesulfonic acid includes alkali metal dibutylnaphthalenesulfonate and an example of the formaldehyde condensation product of alkylnaphthalenesulfonate includes formaldehyde condensation product of alkali metal dibutylnaphthalenesulfonate.

Further, examples of the salt of aliphatic alcohol phosphate include sodium cetyl phosphate.

Examples of the salts include alkali metals, and preferred are lithium, sodium and potassium. Sodium and potassium are most preferred from the viewpoint of cost saving.

Preferred examples of materials of the sulfonate-type anionic surface active agents are as follows:

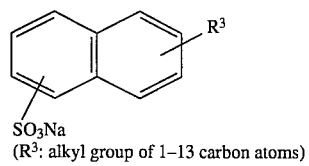

(S-1)

($R^3$: alkyl group of 1–13 carbon atoms)

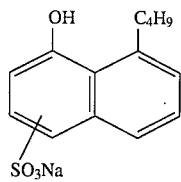 (S-2)

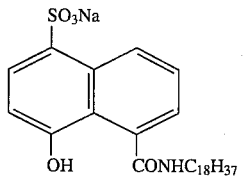 (S-3)

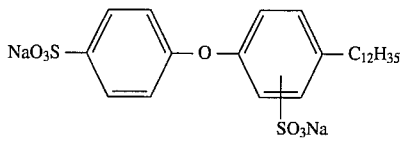 (S-4)

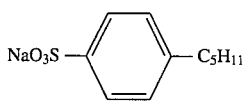 (S-5)

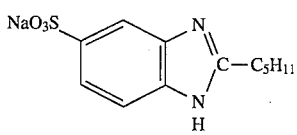 (S-6)

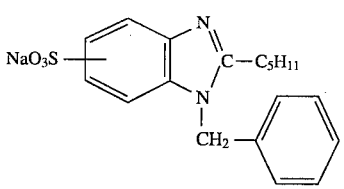 (S-7)

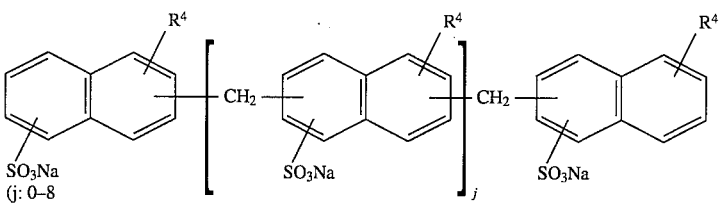 (S-8)

(j: 0–8
$R^4$: H, alkyl group of 1–13 carbon atoms,
alkyl group of 1–8 carbon atoms or hydroxy)

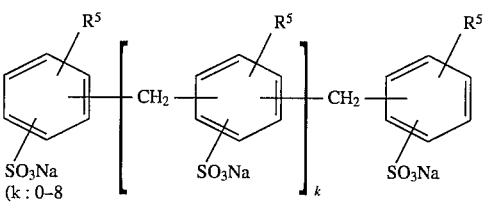 (S-9)

(k: 0–8
$R^5$: H, alkyl group of 1–13 carbon atoms,
alkoxy group of 1–8 carbon atoms or hydroxy)

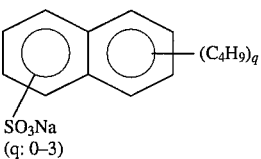 (S-10)

(q: 0–3)

The aqueous alkaline developing solution may contain the anionic surface active agents having the following formulae (1) and (2) (in which the above anionic surface active agents of the invention are eliminated):

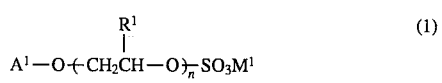

$$A^1-O-(CH_2CH-O)_n-SO_3M^1 \quad (1)$$
(with $R^1$ on the CH)

wherein $A^1$ represents a phenyl group which may have one or more substituents or a naphthyl group which may have one or more substituents, $R^3$ represents hydrogen, an alkyl group having 1 to 6 carbon atoms which may have one or more substituents or an aryl group which may have one or more substituents, $M^1$ represents sodium, potassium or an ammonium group, and n represents a number in the range of 1 to 1,000;

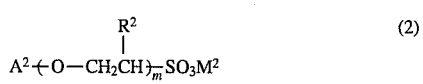

$$A^2-(O-CH_2CH)_m-SO_3M^2 \quad (2)$$
(with $R^2$ on the CH)

wherein $A^2$ represents a phenyl group which may have one or more substituents or a naphthyl group which may have one or more substituents, $R^4$ represents hydrogen, an alkyl group having 1 to 6 carbon atoms which may have one or more substituents or an aryl group which may have one or more substituents, $M^2$ represents sodium, potassium or an ammonium group, and m represents a number in the range of 1 to 1,000.

In the formula (1), the substitutent of $A^1$ includes an alkyl group, a halogen-substituted alkyl group, an alkyl group substituted with a sulfonate (salt) group, an aralkyl group, an aryl group, an alkylaryl group, a halogen-substituted aryl group, an aryl group substituted with a sulfonate (salt) group, halogen and a sulfonate (salt) group. The alkyl group preferably is a straight or branched alkyl group having 1–6 carbon atoms such as methyl, ethyl, n-propyl, isopropyl, n-butyl, isobutyl, n-pentyl or hexyl. The halogen-substituted alkyl group preferably is a group in which the above alkyl group is substituted with 1 to 3 halogens such as chlorine. The alkyl group substituted with a sulfonate group preferably is a group in which the above alkyl group is substituted with 1 to 3 sulfonate groups represented by $-SO_3M^{11}$ (wherein $M^{11}$ is sodium, potassium or ammonium). The aralkyl group preferably is a group in which an aryl group such as phenyl or tolyl is attached to an alkyl group having 1 to 20 carbon atoms (more preferably in α-position of the alkyl group). The aryl group preferably is phenyl or naphthyl. The alkylaryl group preferably is a group in which the above 1 to 3 alkyl groups are attached to the above aryl group. The halogen-substituted aryl group preferably is a group in which 1 to 3 halogens are attached to the above aryl group. The aryl group substituted with a sulfonate (salt) group is preferably a group in which the above 1 to 3 sulfonate groups are attached to the above aryl group. In the case that $A^1$ has the above sulfonate group, the cationic portion $M^{11}$ may be either the same as that of $M^1$ or not.

In the formula (1), $R^3$ preferably is hydrogen, a straight or branched alkyl group having 1 to 6 carbon atoms such as methyl, ethyl, n-propyl, isopropyl, n-butyl, isobutyl, n-pentyl or hexyl, or a group in which halogen such as chlorine is attached to the above alkyl group. Particularly, hydrogen or methyl is preferred.

An anionic surface active agent of the formula (1) obtained by synthesis exactly comprises a mixture of various compounds having "n" of different values one another. Hence, the value of "n" in the formula (1) means an average of compounds constituting the mixture. "n" of the formula (1) preferably is in the range of 2 to 200, more preferably in the range of 2 to 30.

An anionic surface active agent particularly preferred in the anionic surface active agent of the formula (1) is a compound in which $A^1$ is a naphthyl group or a naphthyl group substituted with a sulfonate group, $R^3$ is hydrogen or methyl and n is in the range of 2 to 200. Another particularly preferred anionic surface active agent is a compound in which $A^1$ is a phenyl group substituted with 1 to 3 aralkyl groups, $R^3$ is hydrogen or methyl and "n" is in the range of 2 to 200. The other particularly preferred anionic surface active agent is a compound in which $A^1$ is a phenyl group substituted with 1 to 3 alkyl groups (wherein the total number of carbon atom of the alkyl group is not more than 6), $R^3$ is hydrogen or methyl and n is in the range of 2 to 200.

In the formula (2), $A^2$ preferably is one of the groups as mentioned in $A^1$. In the case that $A^2$ has a sulfonate group represented by $-SO_3M^{21}$ (wherein $M^{21}$ is sodium, potassium or ammonium), the cationic portion $M^{21}$ may be either the same as that of $M^2$ or not. $R^4$ is preferably one of the groups as mentioned in $R^3$.

An anionic surface active agent of the formula (2) obtainable by synthesis exactly comprises a mixture of various compounds having "m" of different values one another. Hence, the value of "m" in the formula (2) means an average of compounds constituting the mixture. "m" of the formula (2) preferably is in the range of 2 to 200, more preferably is in the range of 2 to 30.

An anionic surface active agent particularly preferred in the anionic surface active agent of the formula (2) is a compound in which $A^2$ is a naphthyl group or a naphthyl group substituted with a sulfonate group, $R^4$ is hydrogen or methyl and "m" is in the range of 2 to 200. Another particularly preferred anionic surface active agent is a compound in which $A^2$ is a phenyl group substituted with 1 to 3 aralkyl groups, $R^4$ is hydrogen or methyl and "m" is in the range of 2 to 200. The other particularly preferred anionic surface active agent is a compound in which $A^2$ is a phenyl group substituted with 1 to 3 alkyl groups (wherein a total number of carbon atom of the alkyl group is not more than 6), $R^4$ is hydrogen or methyl and "m" is in the range of 2 to 200.

In the case that an alkaline developing solution containing the anionic surface active agent of the formula (1) or (2) is prepared, the compound may be used in the form of the salt. Alternatively, a compound in which $M^1$ of the formula (1) or $M^2$ of the formula (2) is hydrogen may be dissolved in an alkaline developing solution to prepare an alkaline developing solution employed in the invention. Since hydrogen of $M^1$ or $M^2$ is easily replaced with an alkali component (i.e., sodium, potassium or ammonium group) in the alkaline developing solution, the compound in which $M^1$ or $M^2$ is hydrogen shows the same effect as the compound of the formula (1) or (2).

Subsequently, concrete examples of the formulae (1) and (2) are described below.

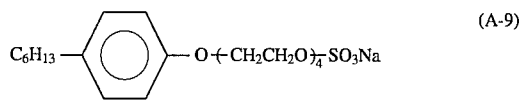
(A-9)

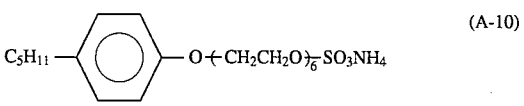
(A-10)

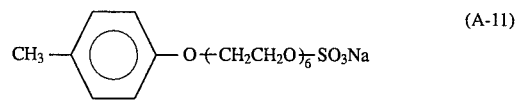
(A-11)

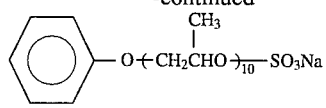

(A-12)

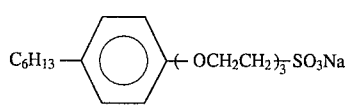

(A-13)

The anionic surface active agent of the formula (1) or (2) can be easily prepared, for example, by reacting a (poly-)alkyleneglycol compound with sulfurous acid or sulfite (salt of sodium, potassium or ammonium group). Some of the anionic surface active agents of the formulae (1) and (2) can be commercially available.

As the nonionic surface active agent contained in the alkaline developing solution which is used in the invention, any nonionic surface active agents can be used.

Examples of the nonionic surface active agents other than those of the invention include:

(i) nonionic surface active agents of polyoxyethylene or polyoxypropylene type such as polyoxyethylene alkyl ethers, polyoxyethylene alkylphenyl ethers (other than the above ethers), polyoxyethylene polystyrylphenyl ethers, polyoxyethylenepolyoxypropylene alkyl ether, polyoxyethylenepolyoxypropylene block polymer, and (ii) nonionic surface active agents of polyhydric alcohol fatty acid ester type such as glycerol fatty acid partial esters, sorbitan fatty acid partial esters, pentaerythritol fatty acid partial esters, propylene glycol fatty acid monoesters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanol amides, N,N-bis-2-hydroxyalkylamines, polyoxyethylenealkylamines, triethanolamine fatty acid esters and trialkylamineoxides.

Preferred are nonionic surface active agents having a polyoxyethylene moiety and/or a polyoxypropylene moiety. Particularly, preferred are polyoxyethylene alkylphenyl ether (other than the above ethers) and polyoxyethylene/polyoxypropylene block polymer.

The image forming process which uses one of the aqueous alkaline developing solutions of the invention, enables the formation of a distinct image on the light-sensitive image forming material (the peel layer) by decreasing fog of a coloring material even when the developing time is shortened, and therefore enables processing of increased number of light-sensitive image forming materials (films) in a definite amount of an alkaline developing solution. Further, such image forming process shows an excellent effect that bubbles hardly occur in the developing solution.

The use of the developing solution of the invention reduces the fog on the support or peel layer to form a distinct image. Accordingly, the developing solution can be utilized advantageously in formation of a color image on a color proofing sheet by a surprint method.

The basic composition of the alkaline developing solution used in the invention contains alkali compounds such as sodium hydroxide, potassium hydroxide, sodium silicate, potassium silicate, trisodium phosphate, tripotassium phosphate, sodium carbonate or potassium carbonate, or organic amine such as methyl amine, dimethyl amine, trimethyl amine, ethyl amine, diethyl amine, triethyl amine, isopropyl amine, diisopropyl amine, n-butyl amine, ethanol amine, diethanol amine, triethanol amine, isopropanol amine, diisopropanol amine, triisopropanol amine, ethylene imine or ethylene diimine. The alkaline developing solution may further contain an organic solvent such as benzyl alcohol, methyl cellosolve, ethyl cellosolve, butyl cellosolve or phenyl cellosolve, a chelating agent, or a poly(N-vinylpyrrolidone). "pH" of the alkaline developing solution is preferred to be not less than 9.5.

The alkaline developing solution of the invention preferably contains a silicone type anti-foaming agent. Examples of the silicone type anti-foaming agent include polydialkylsiloxane (e.g., polydimethylsiloxane), polydiphenylsiloxane or polydialkoxysiloxane. As examples of commercially available products of the silicone type anti-foaming agent, there can be mentioned TSF451-500, TSF451- 1000, TSF451-1M and TSF3000 (these are trade names of Toshiba Silicone Co., Ltd.). The anti-foaming agent is preferably contained in the alkaline developing solution in the range of 0.0001 to 1 weight %, and more preferably in the range of 0.001 to 0.1 weight % based on the total amount of the developing solution.

The image forming process is performed according to a conventional image forming process including the procedures of imagewise exposure, development and after-treatment which are adopted in the case of forming an image using a light-sensitive resin material.

A process for preparation of a color proofing sheet, for example, can be performed utilizing the process of the invention as follows:

Imagewise exposure is conducted by irradiating the light-sensitive image forming material containing a corresponding colorant (pigment) through a color separation mask with ultra violet rays. After the imagewise exposure, the material is developed in the alkaline developing solution of the invention, washed with water and dried. This procedure can be repeated for preparing differently colored elements to obtain the desired separation images with the desired multi colors. The obtained image is then transferred to a image receiving layer (sheet).

The present invention is further described by the following Examples and Comparison Examples.

First, Examples and Comparison Examples which use the alkaline developing solution containing a combination of the anionic surface active agent and the nonionic surface active agent are set forth:

EXAMPLE 1

(A) Preparation of light-sensitive image forming material

A coating solution for forming a peel layer having the following composition was prepared.

Coating solution for peel layer

| | |
|---|---|
| Alcohol-soluble polyamide (CM-8000, viscosity: 23 cps (20° C., 10 weight % methanol solution), available from Toray Industries, Inc.) | 7.2 g |
| Polyhydroxystyrene (Resin M, mean molecular weight: 5,500, available from Maruzen Oil Co., Ltd.) | 1.8 g |
| Methanol | 400 g |
| Methyl cellosolve | 100 g |

The above coating solution was uniformly coated on a polyethylene terephthalate film (support) having the thickness of 100 μm using a whirler, and the coated layer was dried to form a peel layer having thickness of 0.5 μm. Four supports having a peel layer were prepared by repeating the above coating procedure four times.

For the purpose of N → P type image formation, four kids of coating solutions for forming yellow (Y), magenta (M), cyan (C) and black (B) light-sensitive resin layers, which have the following compositions, were prepared.

Coating solution for yellow light-sensitive resin layer

| | |
|---|---|
| Benzyl methacrylate/methacrylic acid copolymer (Copolymerization ratio (molar ratio):73/27, viscosity η:0.12) | 60 g |
| Pentaerythritol tetraacrylate | 43.2 g |
| Michler's ketone | 2.4 g |
| 2-(o-Chlorophenyl)-4,5-diphenylimidazol dimer | 2.5 g |
| Seika Fast Yellow H-0755 (available from Dainichiseika Color & Chemicals Mfg. Co., Ltd.) | 9.4 g |
| Methyl cellosolve acetate | 560 g |
| Methyl ethyl ketone | 280 g |

The above "viscosity η" means limiting viscosity in methyl ethyl ketone solution of the polymer at 25° C.

Coating solution for magenta light-sensitive resin layer

The solution has the same composition as that of the yellow light-sensitive resin layer except for changing the Seika Fast Yellow H-0755 into 5.2 g of Seika Fast Carmine-1483 (available from Dainichiseika Color & Chemicals Mfg. Co., Ltd.).

Coating solution for cyan light-sensitive resin layer

The solution has the same composition as that of the yellow light-sensitive resin layer except for changing the Seika Fast Yellow H-0755 into 5.6 g of Cyanine blue-4920 (available from Dainichiseika Color & Chemicals Mfg. Co., Ltd.).

Coating solution for black light-sensitive resin layer

The solution has the same composition as that of the yellow light-sensitive resin layer except for changing the Seika Fast Yellow H-0755 into 6.6 g of Mitsubishi carbon black MA-100 (available from Mitsubishi Chemical Industries, Ltd.).

Each of the four kinds of coating solutions (four colors) was coated on the peel layer of the support and dried to form a light-sensitive resin layer having thickness of 2.4 μm. Four supports having the four kinds of light-sensitive resin layer were prepared by repeating the above coating procedure four times.

A coating solution for forming a protective layer having the following composition was prepared.

Coating solution for protective layer

| | |
|---|---|
| Polyvinyl alcohol (GL-05, available from Nippon Synthetic Chemical Industry Co., Ltd.) | 60 g |
| Water | 970 g |
| Methanol | 30 g |

The above coating solution was coated on the four light-sensitive resin layers using a whirler, and the coated layers provided on the four light-sensitive resin layers were dried to form protective layers having thickness of 1.5 μm.

Thus, four kinds (four colors) of light-sensitive image forming materials (negative type colored light-sensitive resin materials) comprising a support, a peel layer, a light-sensitive resin layer and a protective layer, superposed in order, were prepared.

(B) Imagewize exposure and development

The light-sensitive image forming materials were exposed through a litho-mask (one obtained by imagewise (in an image based a manuscript) on exposing a silver-halide photosensitive material to light and developing the material) to a light from a super high-pressure mercury lamp (2 kW) at exposing distance of 50 cm. Thus, latent images were formed in the light-sensitive resin layers.

The exposed materials were developed using the developing solutions prepared by adding water of 4000 ml to the original aqueous alkaline developing solution having the following compositions (1) to (9) at 32° C. to form images. The above procedures (A) and (B) were repeated for the all developing solutions.

Developing solution (1)

| | |
|---|---|
| Na$_2$CO$_3$ | 75 g |
| NaHCO$_3$ | 15 g |
| Anionic surface active agent (Pelex NBL) | 150 g |
| Anionic surface active agent (A-1 mentioned above) | 15 g |
| Nonionic surface active agent (C-1) | 3 g |
| Water | 1000 ml |

Note: The anionic surface active agent (Pelex NBL) is sodium alkylnaphthalene sulfonate represented by the following formula, which is Pelex NBL (trade name; solid content: 38 weight %) available from Kao Atlas Co., Ltd.

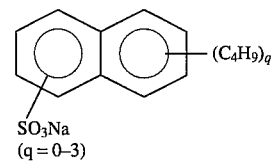

(Pelex NBL)

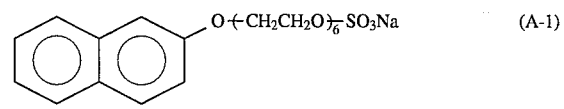

(A-1)

Note: The nonionic surface active agent (C-1) is polyoxyethylene alkylphenyl ether represented by the following formula, which is Neucol 565 (trade name) available Nippon Emulsifying Agent Co., Ltd.

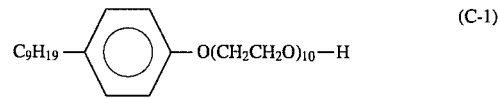

(C-1)

Developing solution

| | |
|---|---|
| Na$_2$CO$_3$ | 75 g |
| NaHCO$_3$ | 15 g |
| Anionic surface active agent (Pelex NBL) | 150 g |
| Anionic surface active agent (A-1 used in (1)) | 15 g |
| Nonionic surface active agent (C-2) | 3 g |
| Water | 1000 ml |

Note:
(C-2)

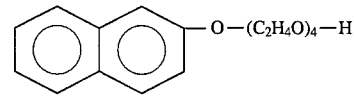

Developing solution

| | |
|---|---|
| $Na_2CO_3$ | 75 g |
| $NaHCO_3$ | 15 g |
| Anionic surface active agent (Pelex NBL) | 150 g |
| Anionic surface active agent (A-3 mentioned above) | 15 g |
| Nonionic surface active agent (C-2 used in (2)) | 3 g |
| Water | 1000 ml |

Note:
(A-3)

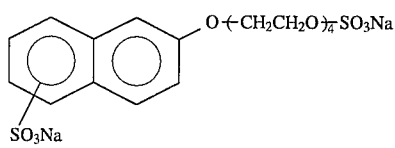

Developing solution

| | |
|---|---|
| $Na_2CO_3$ | 75 g |
| $NaHCO_3$ | 15 g |
| Anionic surface active agent (Pelex NBL) | 15 g |
| Anionic surface active agent (A-5 mentioned above) | 15 g |
| Water | 1000 ml |

Note:
(A-5)

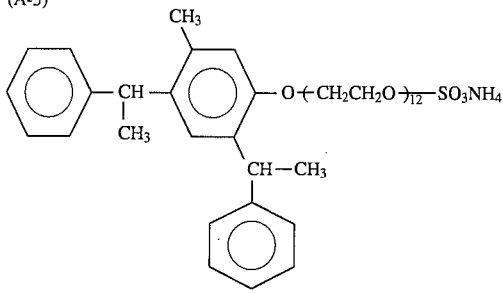

Developing solution (5)

| | |
|---|---|
| $Na_2CO_3$ | 75 g |
| $NaHCO_3$ | 15 g |
| Anionic surface active agent (Pelex NBL) | 15 g |
| Anionic surface active agent (A-6 mentioned above) | 15 g |
| Water | 1000 ml |

Note:
(A-6)

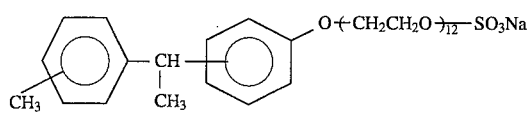

Developing solution (6)

| | |
|---|---|
| $Na_2CO_3$ | 75 g |
| $NaHCO_3$ | 15 g |
| Anionic surface active agent (Pelex NBL) | 150 g |
| Anionic surface active agent (A-5 used in (4)) | 15 g |
| Water | 1000 ml |

Developing solution (7)

| | |
|---|---|
| $Na_2CO_3$ | 75 g |
| $NaHCO_3$ | 15 g |
| Anionic surface active agent (Pelex NBL) | 150 g |
| Anionic surface active agent (A-6 used in (5)) | 15 g |
| Water | 1000 ml |

Developing solution (8)

| | |
|---|---|
| $Na_2CO_3$ | 75 g |
| $NaHCO_3$ | 15 g |
| Anionic surface active agent (Pelex NBL) | 150 g |
| Anionic surface active agent (A-5 used in (4)) | 15 g |
| Nonionic surface active agent (C-2 used in (2)) | 3 g |
| Water | 1000 ml |

Developing solution (9)

| | |
|---|---|
| $Na_2CO_3$ | 75 g |
| $NaHCO_3$ | 15 g |
| Anionic surface active agent (Pelex NBL) | 150 g |
| Anionic surface active agent (A-6 used in (5)) | 15 g |
| Nonionic surface active agent (C-2 used in (2)) | 3 g |
| Water | 1000 ml |

COMPARISON EXAMPLE 1

Light-sensitive image forming materials were prepared in the same manner as in Example 1.

The original aqueous alkaline developing solutions were prepared as follows:

Developing solution (1.0)

| | |
|---|---|
| $Na_2CO_3$ | 75 g |
| $NaHCO_3$ | 15 g |
| Anionic surface active agent (Pelex NBL) | 150 g |
| Water | 1000 ml |

Developing solution (11)

| | |
|---|---|
| $Na_2CO_3$ | 75 g |
| $NaHCO_3$ | 15 g |
| Anionic surface active agent (Pelex NBL) | 150 g |
| Anionic surface active agent (A-1 used in (1)) | 15 g |
| Water | 1000 ml |

Developing solution (12)

| | |
|---|---|
| $Na_2CO_3$ | 75 g |
| $NaHCO_3$ | 15 g |
| Anionic surface active agent (Pelex NBL) | 150 g |
| Nonionic surface active agent (C-1 used in (1)) | 3 g |
| Water | 1000 ml |

(C) Freeze-thaw stability of original aqueous alkaline developing solution

The original aqueous alkaline developing solution was allowed to stand at −10° C. to freeze and left overnight. Then, the solution was thawed at 20° C. It was observed whether precipitate occurred or not in the solution.

The observed result was evaluated according to the following three ranks.

AA: There is no precipitate.
BB: There is a very small amount of precipitate.
CC: There is a significant amount of precipitate.
(D) Evaluation of formed image
(1) Developing time Developing time needed to remove the light-sensitive resin layer on the portion having no image using an auto developing machine (Fuji Color Art Processor CA600PII available from Fuji Photo Film Co., Ltd.) was measured as follows.

The amount of time for which the light-sensitive image forming material passed from the entrance of the developing machine to the exit of the developing machine was measured with variation of the processing speed, and the minimum time for which an obtained image had been unchanged in the extent of the fog was regarded as the developing time.

(2) Fog in a portion having no image

It was observed how a portion (the peel layer) having no image on the light-sensitive resin layer having the formed image was stained by the pigment. The observed result (extent of pigment fog) was evaluated according to the following three ranks.

AA: There is little stain of pigment.
BB: There is some stain of pigment.
CC: There is a significant amount of stain of pigment.

The results of the above evaluation are set forth in Table 1.

TABLE 1

| | Freeze-thaw Stability | Developing time(sec.) | | | | Fog | | | |
|---|---|---|---|---|---|---|---|---|---|
| | | Y | M | C | B | Y | M | C | B |
| Example 1 Developing solution | | | | | | | | | |
| (1) | AA | 15 | 15 | 15 | 15 | AA | AA | AA | AA |
| (2) | AA | 14 | 14 | 14 | 14 | AA | AA | AA | AA |
| (3) | AA | 14 | 14 | 14 | 14 | AA | AA | AA | AA |
| (4) | BB | 15 | 15 | 15 | 15 | AA | AA | AA | AA |
| (5) | BB | 15 | 15 | 15 | 15 | AA | AA | AA | AA |
| (6) | CC | 15 | 15 | 15 | 15 | AA | AA | AA | AA |
| (7) | CC | 15 | 15 | 15 | 15 | AA | AA | AA | AA |
| (8) | AA | 13 | 13 | 13 | 13 | AA | AA | AA | AA |
| (9) | AA | 13 | 13 | 13 | 13 | AA | AA | AA | AA |
| Comparison Ex. 1 Developing solution | | | | | | | | | |
| (1) | CC | 22 | 22 | 22 | 22 | CC | CC | CC | CC |
| (2) | CC | 16 | 16 | 16 | 16 | BB | BB | BB | BB |
| (3) | AA | 18 | 18 | 18 | 18 | BB | BB | BB | BB |

Note; Y:yellow, M:magenta, C:cyan, B:black

As is apparent from data of Table 1, images obtained in Examples which employ the original aqueous alkaline developing solutions containing the Pelex NBL and the specific anionic surface active agent and the specific nonionic surface active agent of the invention showed a distinct image in a reduced developing time, as compared with images obtained by employing the developing solutions (Comparison Examples) containing no above compounds or containing compounds outside the invention similar to the above compounds. Further, such original aqueous alkaline developing solutions exhibit excellent freeze-thaw stability without decrease of the developing characteristics. The nonionic surface active agent generally decreases the developing characteristics as shown in the solution (3) of Comparison Example 1, while the use 10 of the nonionic surface active agent in the invention does not decrease the characteristics due to effect of combination with the specific anionic surface active agent or of combination of the specific nonionic surface active agent with the specific anionic surface active agent.

We claim:

1. An aqueous alkaline developing solution comprising a mixture of an alkali compound, water and an alkylnaphthalene sulfonate having the following formula (I):

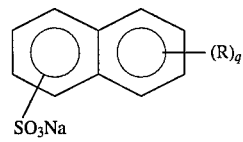

in which R represents an alkyl group of 3 to 5 carbon atoms and q is 0 or an integer of 1 to 3, in the amount of 0.5 to 20 weight %;

and which contains an anionic surface active agent having the following formula (II):

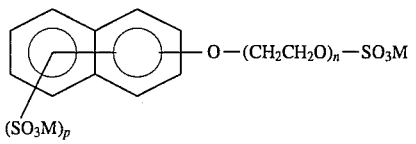

in which M represents Na, K or $NH_4$, p is 0 or 1 and n is 2 to 20, in the amount of 0.1 to 10 weight % and an nonionic surface active agent having a polyoxyethylene moiety and an aromatic ring in its structure in the amount of 0.01 to 4 weight %.

2. The aqueous alkaline developing solution as claimed in claim 1, wherein the aromatic ring of the nonionic surface active agent is a naphthalene ring.

3. The aqueous alkaline developing solution as claimed in claim 1, wherein the ratio of the anionic surface active agent to the nonionic surface active agent is in the range of 1:0.05 to 1:1, by weight.

4. An aqueous alkaline developing solution comprising a mixture of an alkali compound, water and an alkylnaphthalene sulfonate having the following formula (I):

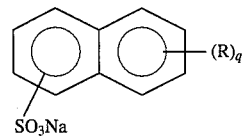

in which R represents an alkyl group of 3 to 5 carbon atoms q is 0 or an integer of 1 to 3, in the amount of 0.5 to 20 weight %;

and which contains an anionic surface active agent having the following formula (III):

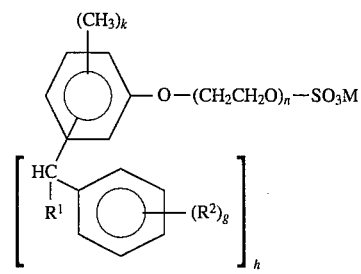

in which each of $R^1$ and $R^2$ represents alkyl of 1 to 5 carbon atoms, M represents Na, K or $NH_4$, g is 0, 1 or 2, k is 0, 1 or 2, h is an integer of 1 to 3, and n is 2 to 20, in the amount of 0.1 to 20 weight %.

5. The aqueous alkaline developing solution as claimed in claim 4, wherein the mixture further contains a nonionic surface active agent having a polyoxyethylene moiety and an aromatic ring in its structure in the amount of 0.01 to 4 weight %.

6. The aqueous alkaline developing solution as claimed in claim 5, wherein the aromatic ring of the nonionic surface active agent is a naphthalene ring.

7. The aqueous alkaline developing solution as claimed in claim 5, wherein the ratio of the anionic surface active agent to the nonionic surface active agent is in the range of 1:0.05 to 1:1, by weight.

* * * * *